United States Patent
Konishi et al.

(10) Patent No.: US 7,378,049 B2
(45) Date of Patent: May 27, 2008

(54) METHOD FOR PRODUCING CERAMIC SUBSTRATE AND ELECTRONIC COMPONENT MODULE USING CERAMIC SUBSTRATE

(75) Inventors: Masao Konishi, Niihama (JP); Masaki Itou, Ozu (JP); Naoki Matuzaki, Ozu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 291 days.

(21) Appl. No.: 11/005,974

(22) Filed: Dec. 7, 2004

(65) Prior Publication Data

US 2005/0151303 A1    Jul. 14, 2005

(30) Foreign Application Priority Data

Dec. 8, 2003    (JP)    ............... 2003-408626

(51) Int. Cl.
*B28B 5/00* (2006.01)
(52) U.S. Cl. ............... 264/618; 264/614; 264/672; 156/89.12
(58) Field of Classification Search ............... 264/614, 264/618, 672; 156/89.12
See application file for complete search history.

(56) References Cited

U.S. PATENT DOCUMENTS

| | | | | |
|---|---|---|---|---|
| 5,370,759 A | * | 12/1994 | Hakotani et al. | 156/73.1 |
| 5,456,778 A | * | 10/1995 | Fukuta et al. | 156/89.17 |
| 5,547,530 A | * | 8/1996 | Nakamura et al. | 156/89.15 |
| 5,843,798 A | * | 12/1998 | Matsuda | 438/106 |
| 6,132,543 A | * | 10/2000 | Mohri et al. | 156/89.12 |
| 7,105,070 B2 | * | 9/2006 | Tosa et al. | 156/89.12 |
| 2003/0100146 A1 | * | 5/2003 | Nakano et al. | 438/118 |

FOREIGN PATENT DOCUMENTS

| | | |
|---|---|---|
| JP | 6-53655 | 2/1994 |
| JP | 7-142630 | 6/1995 |
| JP | 7-202422 | 8/1995 |
| JP | 2000-323806 | 11/2000 |

* cited by examiner

*Primary Examiner*—Steven P. Griffin
*Assistant Examiner*—Russell J Kemmerle, III
(74) *Attorney, Agent, or Firm*—Hamre, Schumann, Mueller & Larson, P.C.

(57) ABSTRACT

A method for producing a ceramic substrate of the present invention includes a first process of providing holes in a shrinkage suppressing layer, a second process of filling the holes with a thick film material, a third process of laminating the shrinkage suppressing layer filled with the thick film material on an outermost layer of a ceramic substrate sintered in a preparatory process, followed by pressing, thereby obtaining a laminate, a fourth process of sintering the laminate, and a fifth process of removing the shrinkage suppressing layer. Thus, the kind of convex portions formed on the outermost layer of the ceramic substrate can be increased.

11 Claims, 7 Drawing Sheets

METHOD FOR PRODUCING CERAMIC SUBSTRATE AND ELECTRONIC COMPONENT MODULE USING CERAMIC SUBSTRATE

BACKGROUND OF THE INVENTION

1. Field of the Invention

The present invention relates to a method for producing a ceramic substrate, and an electronic component module using a ceramic substrate produced by the production method. In particular, the present invention relates to a method for producing a ceramic substrate having convex portions (bumps) on a surface, and an electronic component module using a ceramic substrate produced by the production method.

2. Description of the Related Art

Hereinafter, a conventional method for producing a ceramic substrate with convex portions (bumps) will be described. FIG. 10 shows the processes of the conventional method for producing a ceramic substrate. More specifically, according to the conventional method, via holes are opened in a green sheet for sintering at low temperature (process 1). Thereafter, the via holes are filled with a conductor made of a silver paste (process 2). An inner layer conductor is formed on a surface layer of the green sheet filled with the conductor, whereby a plurality of green sheets with the inner layer conductors formed thereon are prepared (process 3). Separately from these processes, for pressing the green sheets, via holes are opened in a shrinkage suppressing layer made of an unbaked sheet that is not sintered at the sintering temperature of the green sheets (process 4), and the via holes formed in the process 4 are filled with a conductor (process 5). The green sheets formed in the process 3 are laminated, and the shrinkage suppressing layer filled with the conductor formed in the process 5 is laminated on an outermost layer of the laminate, followed by pressing (process 6). After the process 6, the resultant laminate is sintered at about 900° C. (process 7). After the process 7, the shrinkage suppressing layer laminated in the process 6 is removed (process 8). Consequently, a substrate with convex portions as shown in FIG. 11 is completed.

FIG. 11 shows a specific example of an electronic component module using a substrate with convex portions. Reference numeral 11 denotes a ceramic substrate in which a laminate of green sheets is sintered at low temperature, 12 denotes inner vias each connecting an upper surface to a lower surface of each layer of the ceramic substrate 11, and 13 denotes inner layer patterns. Reference numeral 14a denotes convex portions composed of a conductor formed on a lowermost layer 11b of the ceramic substrate 11, and 20 denotes a surface layer pattern connected to the convex portions 14a. Furthermore, reference numeral 15 denotes convex portions composed of a conductor formed on an uppermost layer 11a of the ceramic substrate 11, which is connected to a surface layer pattern 16 on the uppermost layer 11a and the inner vias 12.

Reference numeral 17 denotes a flip chip IC mounted on the upper surface of the ceramic substrate 11. A connection layer 18 formed on a bottom surface of the flip chip IC 17 is connected to the convex portions 15. Thus, an electronic component module 19 as a surface mounting module is completed. The prior art related to the invention of the present application is, for example, described in JP6 (1994)-53655A.

However, according to the conventional method for producing a ceramic substrate with convex portions, the shrinkage suppressing layer filled with a conductor is laminated on a green sheet laminate that has not been sintered, and thereafter, the shrinkage suppressing layer and the green sheet laminate are sintered simultaneously, whereby convex portions are formed. At this time, the green sheet laminate needs to be sintered, so that sintering is performed at a maximum temperature of 900° C. for a retention time of 20 minutes (JP6(1994)-53655A). In general, the baking temperature of a conductor, a dielectric (insulator), and a resistant material used as a thick film material is in a range of 850° C.±50° C., and the baking temperature at the center of a distribution is lower than about 900° C. that is the sintering temperature of the green sheet laminate. Thus, according to the conventional production method, only a conductive material that is baked at 900° C. can be used, and a general thick film material cannot be selected arbitrarily to form convex portions.

For example, the material for convex portions in JP6 (1994)-53655A is limited to a conductive material containing no glass frit. However, the glass frit is largely related to the connection strength between the convex portions and the green sheets; therefore, when the convex portions are formed of a conductor containing no glass frit, convex portions with low connection strength with respect to the substrate or ceramic surface are likely to be formed. Thus, the convex portions formed by this method have low connection reliability.

Furthermore, according to the prior art, convex portions composed of a mixture of different kinds of thick film materials (i.e., convex portions in which a dielectric and a conductor are mixed) cannot be formed. Therefore, the following problem arises. There is a limit to a dimension 21 between the convex portions 14a and 14b including the surface layer pattern 20. That is, as shown in FIG. 12, when the electronic component module 19 is soldered to a parent substrate 22, if the dimension 21 is small, a short due to soldering occurs between the convex portions 14a and 14b including the surface layer pattern 20.

Herein, reference numeral 23a denotes lands formed on an upper surface of the parent substrate 22, and the lands 23a are provided at positions corresponding to the convex portions 14a. Similarly, reference numeral 23b denotes lands provided at positions corresponding to the convex portions 14b.

SUMMARY OF THE INVENTION

Therefore, with the foregoing in mind, it is an object of the present invention to provide a method for producing a ceramic substrate in which a material for convex portions formed on an outermost layer of a ceramic substrate can be selected widely without being bound by the baking condition of a green sheet laminate, connection reliability is high, and a short between electrodes formed of convex portions is eliminated.

A method for producing a ceramic substrate having convex portions composed of a thick film material on a surface according to the present invention includes: a first process of providing holes in an unbaked sheet; a second process of filling the holes with the thick film material after the first process; a third process of laminating the unbaked sheet filled with the thick film material on an outermost layer of a sintered ceramic substrate, followed by pressing, thereby forming a laminate, after the second process; a fourth process of sintering the laminate after the third process; and a fifth process of removing the unbaked sheet after the fourth process.

An electronic component module according to the present invention uses a ceramic substrate having convex portions composed of a thick film material on a surface, wherein holes are opened in an unbaked sheet, the holes are filled with the thick film material, the unbaked sheets filled with the thick film material are laminated on a front surface and a back surface of outermost layers of the sintered ceramic substrate, followed by pressing, thereby forming a laminate, the laminate is sintered, and the unbaked sheets are removed, and an electronic component is mounted on at least one surface selected from the front surface and the back surface of the obtained ceramic substrate.

These and other advantages of the present invention will become apparent to those skilled in the art upon reading and understanding the following detailed description with reference to the accompanying figures.

DESCRIPTION OF THE PREFERRED EMBODIMENTS

Figure 1:
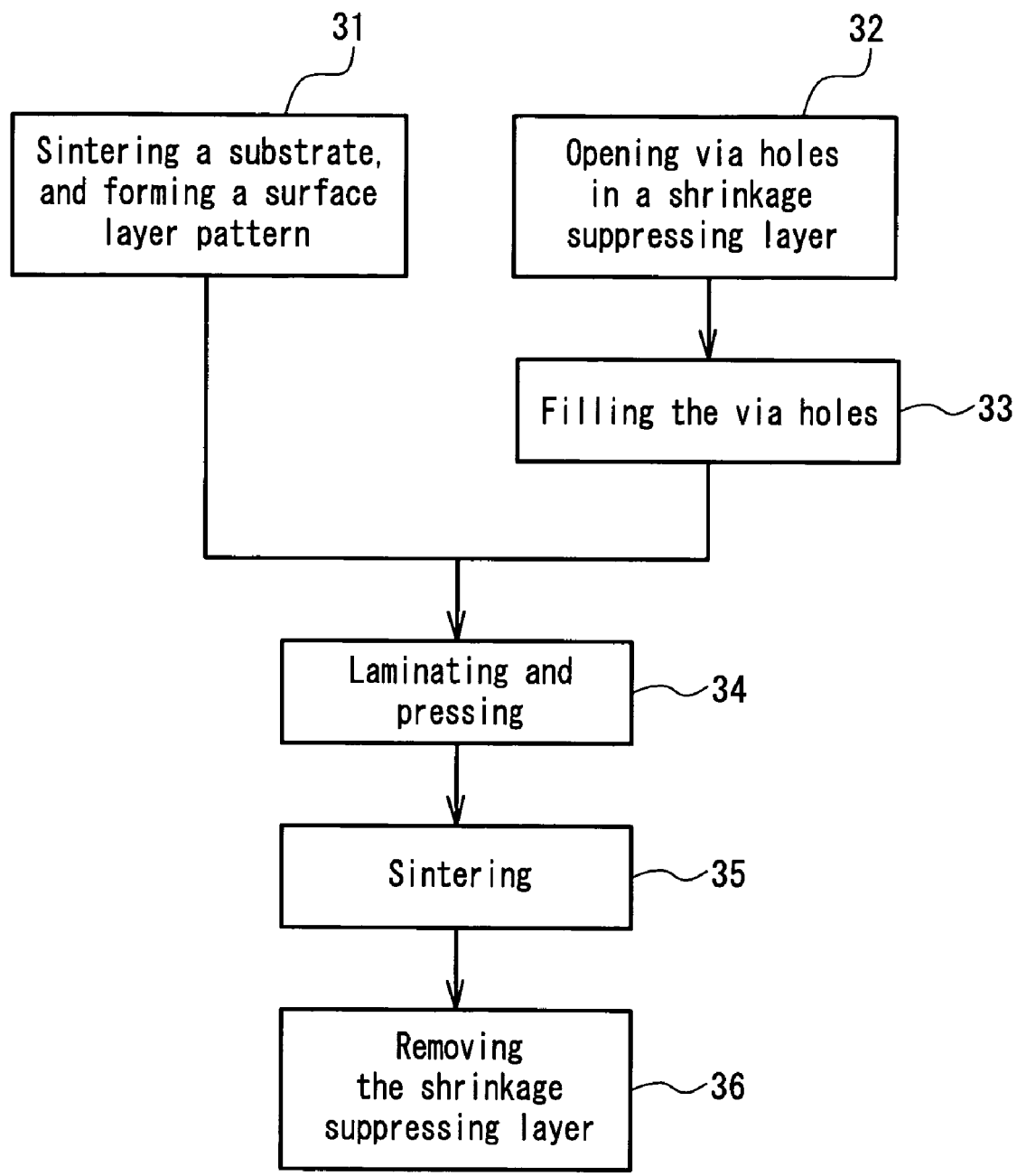
FIG. 1 is a production process flow chart for a ceramic substrate in Embodiment 1 of the present invention.

According to the present invention, the inconvenience of convex portions formed on an outermost layer of a ceramic substrate can be eliminated. That is, holes provided in an unbaked sheet can be filled with a general thick film material. Thus, the convex portions formed on the outermost layer of the ceramic substrate can be composed of a conductor as well as an insulator. For example, even if the distance between the convex portions (projection electrodes) composed of a conductor is decreased, a short therebetween can be prevented by forming convex portions composed of an insulator between the projection electrodes. The ceramic substrate has already been sintered in the third process, so that a thick film material that is baked in the vicinity of the sintering temperature of the ceramic substrate can be selected, and hence, the thick film material can be selected from a wide variety of kinds. Furthermore, since the holes provided in the unbaked sheet are filled with a thick film material, the shape of convex portions composed of the thick film material becomes precise and uniform. Thus, in the case of using the present invention as a high-frequency component, in particular, a ceramic substrate having uniform performance in terms of a high frequency can be realized.

The present invention includes the process of filling holes, provided in an unbaked sheet, not only with a conductor but also with a thick film material other than the conductor such as an insulator. According to this configuration, the inconvenience of convex portions formed on the outermost layer of a ceramic substrate can be eliminated. For example, even if the distance between the convex portions used as electrodes is small, a short can be prevented by providing convex portions composed of an insulator between the convex portions used as electrodes.

According to the present invention, holes provided in an unbaked sheet are filled with a thick film material. This means that the convex portions formed on the outermost layer of the ceramic substrate can be composed of a conductor as well as an insulator. For example, even if the distance between the convex portions (projection electrodes) composed of a conductor is small, a short between the projection electrodes can be prevented by forming convex portions composed of an insulator between the projection electrodes.

In the second process, it is preferable that a pressure is in a range of 50 to 200 kPa/cm².

Furthermore, in the third process, since the ceramic substrate already has been sintered, a generally used thick film material that is sintered at about 850° C. can be selected, and hence, a material for the thick film material can be selected from a wide variety of kinds.

Furthermore, the holes provided in the unbaked sheet are filled with a thick film material, so that the shape of convex portions composed of the thick film material become precise and uniform. Thus, in the case of using the present invention as a high-frequency component, in particular, a ceramic substrate having uniform performance in terms of a high frequency can be realized.

It is preferable that the ceramic substrate is sintered at 800° C. or higher in the third process, and a material for the thick film material can be selected from a wide variety of kinds that are baked by heating at about 500° C. to 950° C.

After the third process, a degreasing process of degreasing the laminate by forceful heating may be performed, and then, the fourth process may be performed.

Furthermore, the sintering temperature of the laminate in the fourth process may be set to be the same as that of the thick film material.

The thick film material preferably is at least one selected from a conductor, an insulator, a dielectric, and a resistant material. As the kind of the convex portions formed on the outermost layer of the ceramic substrate, an insulator, a dielectric, a resistant material, or the like is selected arbitrarily, in addition to the conductor as projection electrodes, a more highly integrated multifunctional ceramic substrate can be realized. As the thick film material, any two or more of a conductor, an insulator, a dielectric, and a resistant material may be combined. As the kind of the convex portions formed on the outermost layer of the ceramic substrate, an insulator, a dielectric, a resistant material, and the like can be used in combination, in addition to the conductor for projection electrodes. Thus, when convex portions composed of an insulator are formed between the projection electrodes, even if the distance between the projection electrodes is decreased, a short and the like will not occur therebetween.

As the unbaked sheet, alumina powder and an organic binder can be mixed to form an alumina sheet. The mixed ratio between the alumina powder and the organic binder preferably is as follows: the organic binder is in a range of 10 to 15 parts by mass with respect to 100 parts by mass of alumina powder. Furthermore, it is preferable that the average particle diameter of alumina powder is in a range of 1.0 to 2.5 μm. An acrylic organic binder is used. The unbaked sheet is formed of alumina powder and an organic binder, so that it is not baked at about 500° C. to about 950° C. Thus, a material for convex portions can be selected from a variety of thick film materials conventionally used in a thick film hybrid IC.

In the third process, the unbaked sheets filled with the thick film materials may be laminated on a front surface and a back surface of the outermost layers of the ceramic substrate. According to this configuration, convex portions can be formed on the front surface and the back surface. Thus, if the ceramic substrate is used, a surface mounting electronic component module with an electronic component and the like mounted on a surface can be formed.

In the third process, a plurality of unbaked sheets filled with thick film materials may be laminated, and the resultant laminate may be laminated on the outermost layer of the sintered ceramic substrate. Since a plurality of unbaked sheets filled with thick film materials are laminated, the height of the convex portions can be increased.

Since the electronic component module of the present invention has an electronic component mounted on its surface, if the convex portions formed on the back surface are composed of a conductor, a surface mounting electronic component module can be obtained.

The electronic components may be mounted respectively on the front surface and the back surface, whereby a compact electronic component module can be obtained.

Furthermore, a plurality of unbaked sheets may be laminated. According to this configuration, the height of the convex portions can be increased. Thus, if the convex portions are composed of an insulator, an electronic component module with a short between electrodes prevented can be obtained.

It is preferable that a plurality of holes are opened in the ceramic substrate in a thickness direction thereof, the holes close to each other are filled with an conductive paste and an insulating paste, and these pastes are sintered to form convex portions. It is preferable that the height of the convex portions is in a range of 25 to 300 μm. The height of the convex portions depends upon the thickness of the unbaked sheet. More specifically, the coating amount of the convex portions can be set so as to correspond to the thickness of the unbaked sheet, and the final height of the convex portions is determined by the shrinkage amount of a material for the convex portions during sintering. In general, the height of a thick film paste of a conductor becomes about a half of that of the unbaked sheet. For example, in the case of using an unbaked sheet having a thickness of 50 μm, the height of projection electrodes of an sintered sheet becomes about 25 μm. Furthermore, in the case of using two laminated unbaked sheets each having a thickness of 300 μm, the height of the projection electrodes of a sintered sheet becomes about 300 μm. This also applies to the case where the convex portions are formed using a thick film paste of a dielectric (insulator). It is preferable that the diameter of the convex portions is in a range of 50 to 500 μm. Furthermore, it is preferable that the distance between the convex portion composed of a conductor and the convex portion composed of an insulator is at least 50 μm.

Hereinafter, a method for producing a ceramic substrate and an electronic component module using a ceramic substrate produced by the production method will be described with reference to the drawings.

Embodiment 1

FIG. 1 is a production process flow chart for a method for producing a ceramic substrate in Embodiment 1. In FIG. 1, reference numeral 31 denotes a preparatory process. In the preparatory process 31, a substrate is sintered at 800° C. to 1500° C., and a surface layer pattern is formed on an outermost layer of the sintered substrate. Reference numeral 32 denotes a first process of opening via holes for forming convex portions in a shrinkage suppressing layer (used as an example of an unbaked sheet), and 33 denotes a second process of filling the via holes formed in the shrinkage suppressing layer with a thick film material after the first process 32. The via holes may be filled with the thick film material as follows: the shrinkage suppressing layer with the via holes formed therein is placed on a porous plate, the via holes in the shrinkage suppressing layer are aspirated via the porous plate, and simultaneously, the thick film material is supplied to the via holes from a surface opposite to the surface of the shrinkage suppressing layer in contact with the porous plate, using a metal mask or a screen plate.

Then, in the third process 34, the shrinkage suppressing layer formed in the second process 33 is laminated on the outermost layer of the sintered substrate with a surface pattern formed thereon in the preparatory process 31, followed by pressing, whereby a laminate is formed. At this time, the laminate is pressed and heated so as to be integrated. In the present example, the laminate was pressed at 100 to 200 kgf/cm$^2$ while being heated to 50° C. to 100° C. Then, in the fourth process 35, the shrinkage suppressing layer of the laminate is degreased, and is sintered at a temperature at which the thick film material is baked, whereby the thick film material filling the via holes of the shrinkage suppressing layer is baked together with the sintered substrate. The sintering temperature at this time is in a range of 850° C.±50° C. that is a baking temperature of a general thick film material, and may be determined depending upon the thick film material to be used. After the fourth process 35, a ceramic substrate having projection electrodes is completed via the fifth process 36 of removing the shrinkage suppressing layer.

Figure 2A:
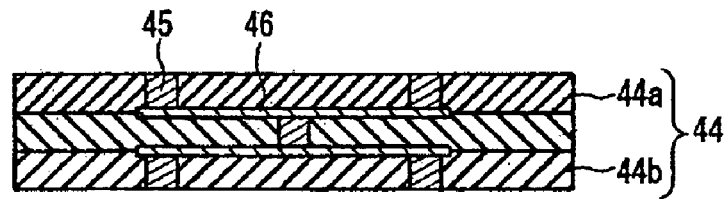
FIG. 2A is a cross-sectional view of a ceramic substrate sintered at high temperature in a preparatory process in Embodiment 1 of the present invention.

FIG. 2A is a cross-sectional view of a sintered substrate formed in the preparatory process 31 shown in FIG. 1. The substrate has been sintered at 800° C. to 1500° C. More specifically, reference numeral 44 denotes a ceramic substrate in which a laminate of green sheets has already been sintered, and reference numeral 45 denotes inner vias connecting an upper surface to a lower surface of each layer. Reference numeral 46 denotes inner layer conductor patterns provided on an inner layer of the ceramic substrate 44.

Figure 2B:
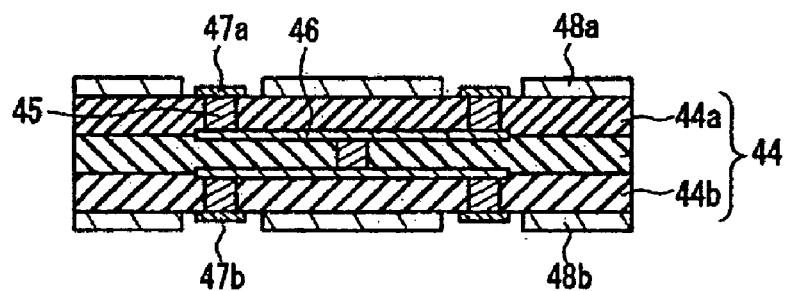
FIG. 2B is a cross-sectional view of a ceramic substrate after the outermost layers are treated in Embodiment 1 of the present invention.

FIG. 2B is a cross-sectional view after the outermost layers of the ceramic substrate 44 are treated. That is, a surface pattern 47a is formed on an uppermost layer 44a of the ceramic substrate 44, and thereafter, an insulator 48a is printed thereon. Similarly, a surface pattern 47b is formed on a lowermost layer 44b of the ceramic substrate 44, and thereafter, an insulator 48b is printed thereon. FIGS. 2A and 2B correspond to the preparatory process 31 shown in FIG. 1.

Figure 2C:
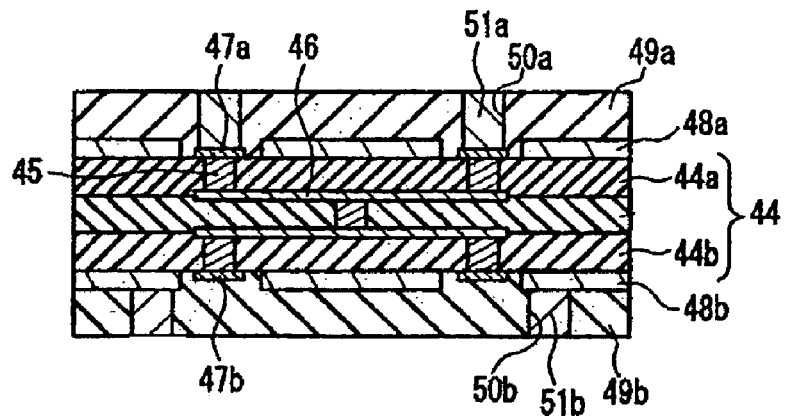
FIG. 2C is a cross-sectional view of a laminate in which shrinkage suppressing layers are laminated on the outermost layers in a third process in Embodiment 1 of the present invention.

FIG. 2C is a cross-sectional view showing that a shrinkage suppressing layer 49a is laminated on an outer side of the uppermost layer 44a shown in FIG. 2B, and a shrinkage suppressing layer 49b is laminated on an outer side of the lowermost layer 44b, whereby a laminate is obtained. Holes 50a (diameter: 0.3 mm) for forming convex portions are provided in the shrinkage suppressing layer 49a, and the holes 50a are filled with a silver paste 51a (for forming projection electrodes) containing 90% by mass of Ag particles (average particle size: 2 μm) as metal particles and a small amount of glass frit (2% by mass). The material for the conductive paste is not limited to the above-mentioned silver paste, and a conductor paste containing metal particles (at least 70% by mass) that mainly contain Ag and Au and are supplied with Pd, Mo, etc., a small amount of glass frit (2% by mass), a binder (5% by mass), and a solvent (20% by mass) may be used.

Furthermore, holes 50b (diameter: 0.3 mm) for forming convex portions also are provided on the shrinkage suppressing layer 49b, and the holes 50b are filled with an insulator 51b. The insulator 51b is composed of a plurality of kinds of dielectric glasses (60% by mass) mainly containing silicon oxide, a binder (10% by mass), and a solvent (30% by mass). The material for the insulator 51b is not limited to silicon oxide, and an insulating paste prepared so as to be sintered at 800° C. to 900° C. containing a glass material, a binder, and a solvent may be used.

The inorganic material contained in the shrinkage suppressing layers 49a and 49b is formed of only alumina. Therefore, the shrinkage suppressing layers 49a and 49b are not baked in the fourth process 35, i.e., at a sintering temperature of 850° C.±50° C. Furthermore, the shrinkage suppressing layers 49a and 49b are not subjected to deformation (expansion, shrinkage, etc.). The thickness of the shrinkage suppressing layer desirably is 0.05 mm to 1.0 mm. In the present embodiment, the shrinkage suppressing layer with a thickness of 0.3 mm is used.

Thus, a laminated substrate, in which the shrinkage suppressing layers and the substrate with a pattern formed on a surface layer are integrated, is heated at 400° C. for 5 hours so that the shrinkage suppressing layers are degreased, followed by sintering at 850° C. The sintering temperature is not limited to 850° C., and may be appropriately selected in accordance with the sintering temperature of a thick film material to be used. Thus, the filling thick film materials 51a and 51b shrink by about 0.15 mm only in a vertical direction (are retained in a horizontal direction), and the binder in the shrinkage suppressing layers 49a and 49b is thermally decomposed, whereby the shrinkage suppressing layers 49a and 49b become very fragile and peelable. Accordingly, in the fifth process 36, the shrinkage suppressing layers 49a and 49b are removed. Because of this, a ceramic substrate is completed.

Figure 2D:
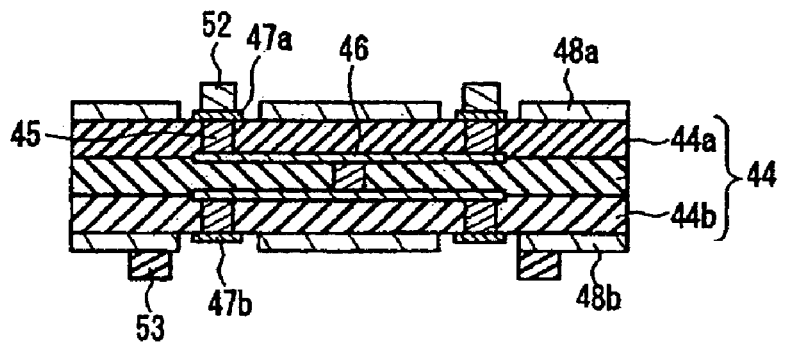
FIG. 2D is a cross-sectional view of the ceramic substrate with the shrinkage suppressing layers removed after sintering in a fifth process in Embodiment 1 of the present invention.

That is, as shown in FIG. 2D, projection electrodes 52 connected to the inner vias 45 are formed on the uppermost layer 44a of the ceramic substrate 44. Furthermore, a convex insulator 53 is formed on the lowermost layer 44b of the ceramic substrate 44. The insulator 53 is formed on the lowermost layer 44b; therefore, when the electronic component module is mounted on a parent substrate, even if the inner vias 45 and the surface layer pattern 47b of the lowermost layer 44b are exposed, a short will not occur between the inner vias 45 and the surface layer pattern 47b, and the wiring pattern of the parent substrate.

The diameter of the holes for convex portions formed in the shrinkage suppressing layers 49a, 49b is not limited to 0.3 mm, and can be selected arbitrarily from diameters that can be used in the via filling method in the present example, for example, in a range of 0.05 to 0.5 mm.

The height of the convex portions is 150 μm, the diameter thereof is 200 μm, and the distance between the convex portions composed of a conductor and the convex portions composed of an insulator is 50 μm or more.

Embodiment 2

Figure 3:
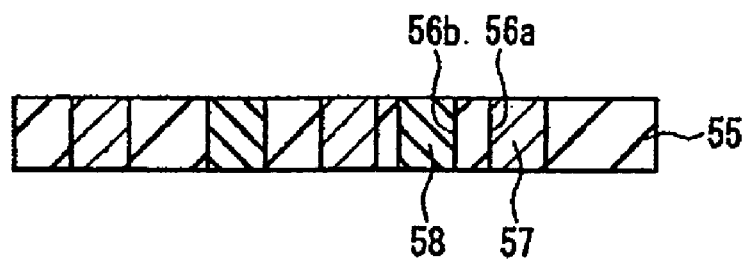
FIG. 3 is a cross-sectional view of a shrinkage suppressing layer in Embodiment 2 of the present invention.

FIG. 3 is a cross-sectional view of a shrinkage suppressing layer 55 in Embodiment 2. As shown in FIG. 3, holes 56a, 56b formed in the shrinkage suppressing layer 55 can be filled with a plurality of thick film materials. For example, the hole 56a is filled with a conductive paste 57 that is a conductive material described in Embodiment 1, and the hole 56b is filled with an insulating paste 58 described in Embodiment 1. In addition, the holes 56a and 56b also can be filled with a dielectric, a resistant material, etc. The dielectric may be at least one kind of glass material prepared so as to be crystallized at 800° C. to 900° C., instead of only silicon oxide as described above. Furthermore, the resistant material may be made of a resistant substance mainly containing $RuO_2$, a binder, and a solvent.

Figure 4:
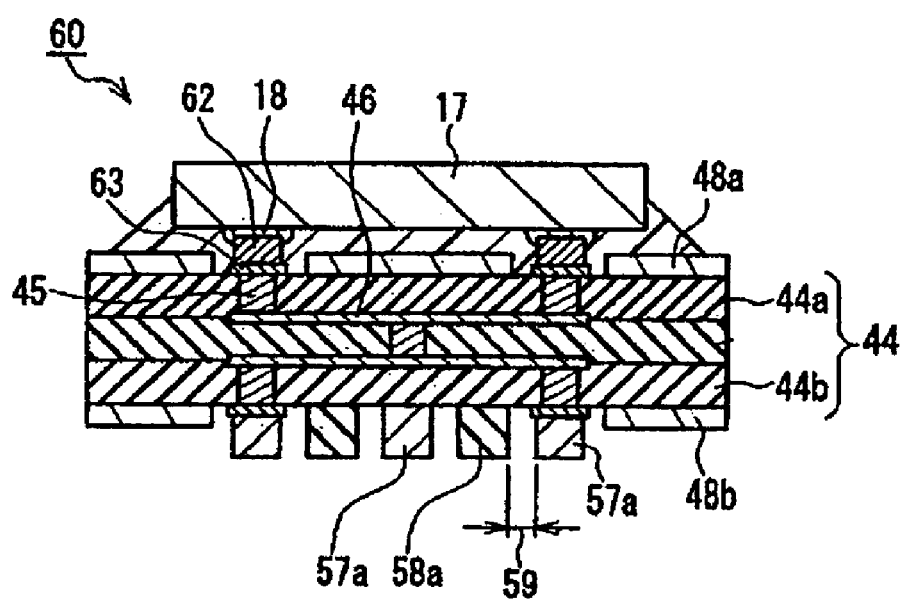
FIG. 4 is a cross-sectional view of an electronic component module using a ceramic substrate in Embodiment 2 of the present invention.

By using the shrinkage suppressing layer 55 filled with the conductive paste 57 and the insulator 58, in place of the shrinkage suppressing layer 49b in Embodiment 1, an electronic component module 60 as shown in FIG. 4 can be obtained.

Figure 12:
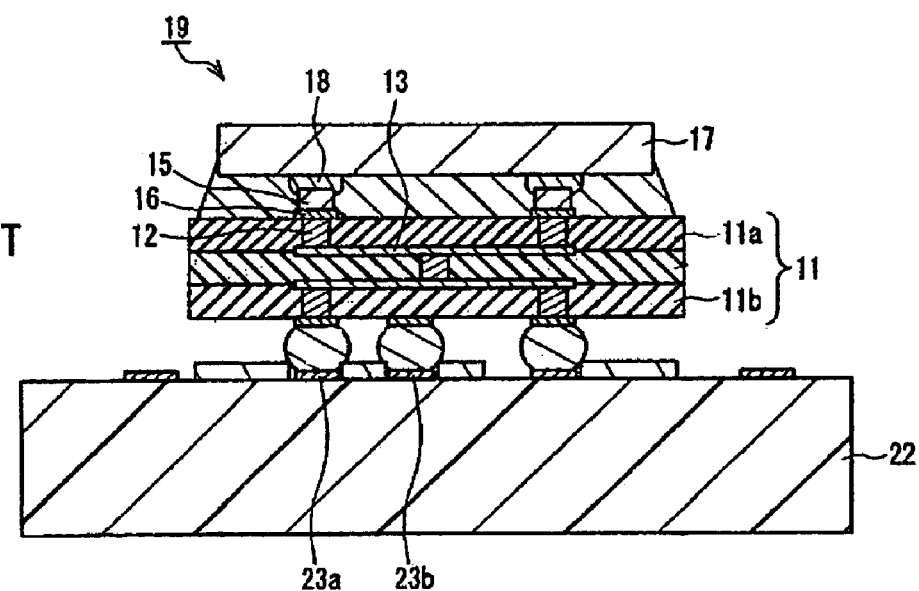
FIG. 12 is a cross-sectional view showing the conventional electronic component module mounted on a parent substrate.

In FIG. 4, reference numeral 57a denotes projection electrodes sintered to be formed in the fourth process 35 on the lowermost layer 44b of the ceramic substrate 44 after sintering. Reference numeral 58a denotes an insulator formed between the projection electrodes 57a. The insulator 58a is formed between the projection electrodes 57a in this manner; therefore, even if the distance 59 between the projection electrodes 57a is small, a short will not occur between the projection electrodes, as shown in the conventional example (FIG. 12) during soldering.

Furthermore, reference numeral 62 denotes convex portions (projection electrodes) formed on the uppermost layer 44a of the ceramic substrate 44, and the projection electrodes 62 are connected to a surface layer pattern 63 formed on the uppermost layer 44a and the inner vias 45 formed therein. Reference numeral 17 denotes a flip chip IC mounted on the upper surface of the ceramic substrate 44, and a connection layer 18 is formed on the bottom surface of the flip chip IC 17. Then, the connection layer 18 is connected to the projection electrodes 62. Thus, by forming the insulator 58a, a short due to soldering between the projection electrodes 57a when the electronic component module 60 is mounted on a parent substrate can be prevented. Furthermore, the electronic component module 60 has projection electrodes, so that it can be surface-mounted on a parent substrate.

Embodiment 3

Figure 5A:
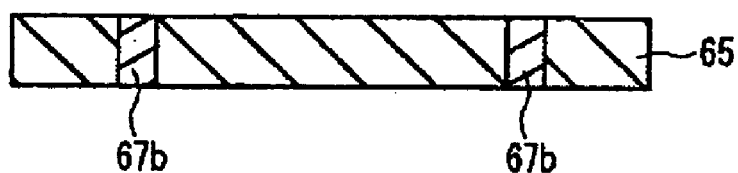
FIGS. 5A and 5B are cross-sectional views of shrinkage suppressing layers in Embodiment 3 of the present invention.
Figure 5B:
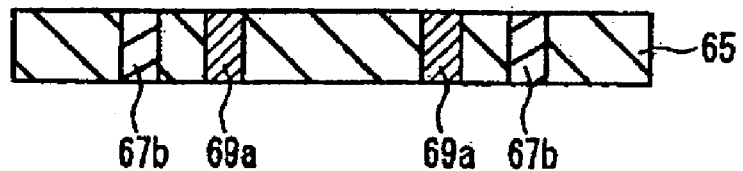

FIGS. 5A and 5B are cross-sectional views of the shrinkage suppressing layer 65 in Embodiment 3. As shown in FIG. 5A, holes provided in one shrinkage suppressing layer 65 are filled with an insulator 67b as a thick film material. As shown in FIG. 5B, holes provided in the other shrinkage suppressing layer 65 at the same positions as those in FIG. 5A are filled with an insulator 67b, and the other holes are filled with a conductive paste 69a. By stacking the shrinkage suppressing layers 65 filled with the insulator 67b and the conductive paste 69a on one side, a ceramic substrate 68 as shown in FIG. 6 can be obtained.

Figure 6:
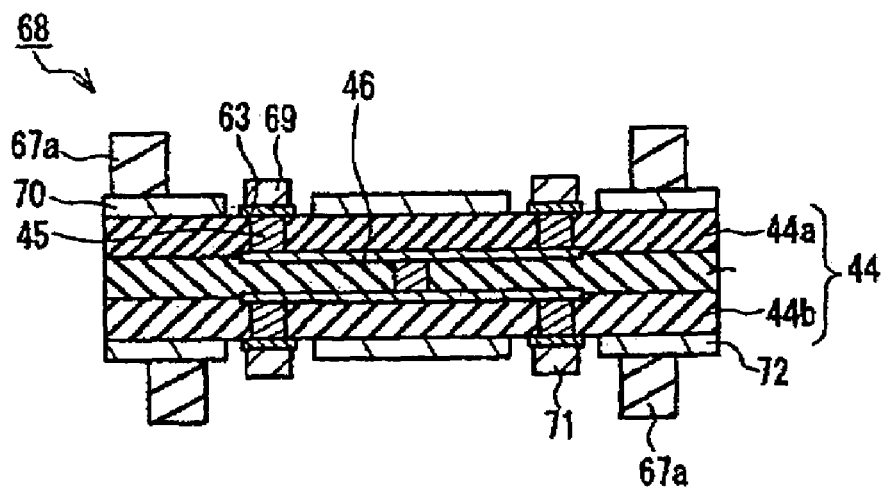
FIG. 6 is a cross-sectional view of a ceramic substrate in Embodiment 3 of the present invention.

That is, in FIG. 6, using the method of Embodiment 2, the projection electrodes 69a and the insulator 67b shown in FIG. 5B are previously laminated on the uppermost layer 44a of the ceramic substrate 44, and the insulator 67a is laminated thereon at positions corresponding to the insulator 67b, using the shrinkage suppressing layer 65 shown in FIG. 5A. Similarly, using the method of Embodiment 2, the projection electrodes 71 and the insulator 72 are previously laminated on the lowermost layer 44b of the ceramic substrate 44, and the insulator 67a is laminated thereon at positions corresponding to the insulator 72, using the shrinkage suppressing layer 65. Thereafter, degreasing and sintering are performed to remove the shrinkage suppressing layers.

Figure 7:
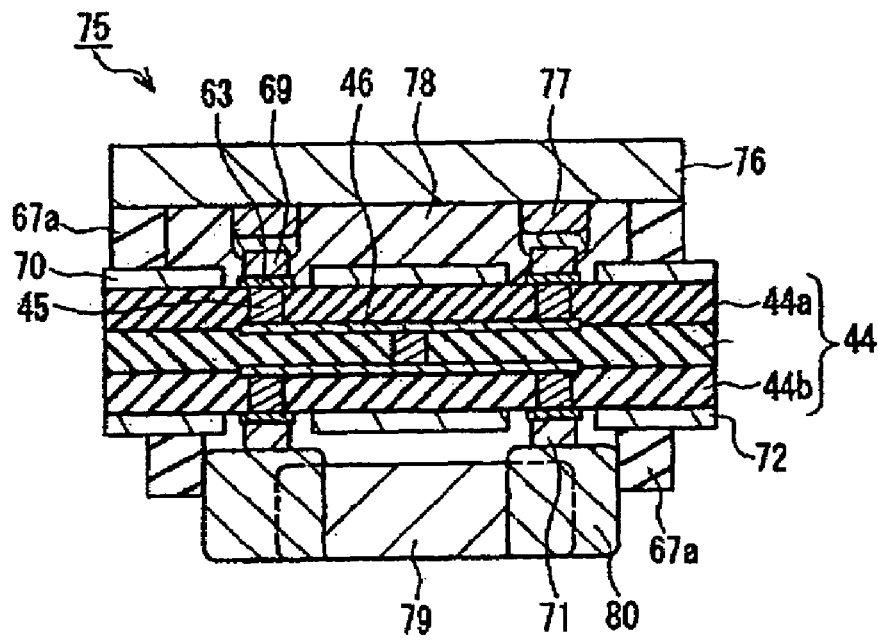
FIG. 7 is a cross-sectional view of an electronic component module using the ceramic substrate in Embodiment 3 of the present invention.

The ceramic substrate 68 thus obtained can form an electronic component module 75 as shown in FIG. 7. More specifically, a flip chip IC 76 is placed on the upper surface of the ceramic substrate 44, and pads 77 of the flip chip IC 76 are connected to the projection electrodes 69. Reference numeral 78 denotes an underfill inserted between the uppermost layer 44a of the ceramic substrate 44 and the flip chip IC 76. In this case, the insulators 70 and 67a form an enclosure at an outer end of the electronic component module 75, so that the underfill 78 will not flow outside.

Furthermore, on the lowermost layer 44b of the ceramic substrate 44, a shrinkage suppressing layer (not shown) further is laminated below the insulator 72, whereby the insulator 72 and the insulator 67a are formed so as to be overlapped with each other. Reference numeral 79 denotes a chip component, which is connected to the projection electrodes 71 with a solder 80.

Thus, the insulators 72 and 67a are formed so as to surround the chip component 79, so that the solder 80 will not flow outside, and strong soldering can be performed in a small space. The resultant product also is satisfactory in terms of appearance.

Furthermore, by using a resistant material or a dielectric in place of the projection electrodes 71, a capacitor also can be formed between the resistant material or the dielectric and a chip resistor that is a kind of the chip component 79.

Embodiment 4

Figure 8:
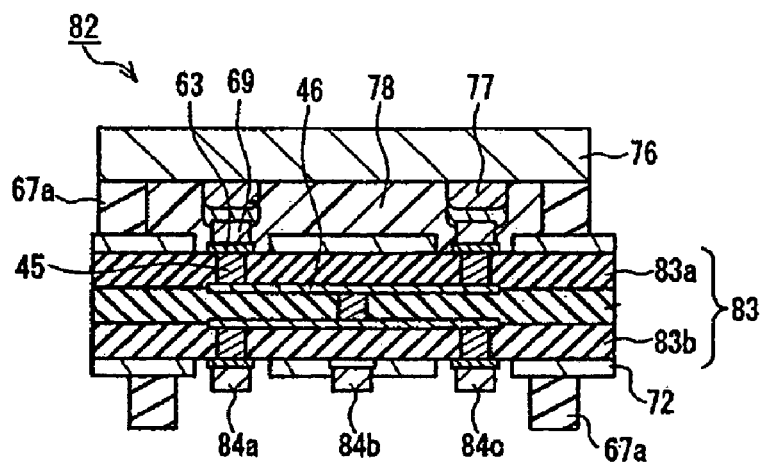
FIG. 8 is a cross-sectional view of an electronic module in Embodiment 4 of the present invention.

FIG. 8 is a cross-sectional view of an electronic component module 82 in Embodiment 4. The electronic component module 82 has a configuration in which the flip chip IC 76 is mounted on an uppermost layer 83a of a ceramic substrate 83 in the same way as in Embodiment 3. On a lowermost layer 83b of the ceramic substrate 83, projection electrodes 84a, 84b, and 84c are provided so as to be close to each other. Furthermore, on the lowermost layer 83b of the ceramic substrate 83, the insulators 72 and 67a are formed so as to be overlapped with each other. That is, the insulator 67a is formed so as to be higher than the projection electrodes 84a, 84b, and 84c.

Figure 9:
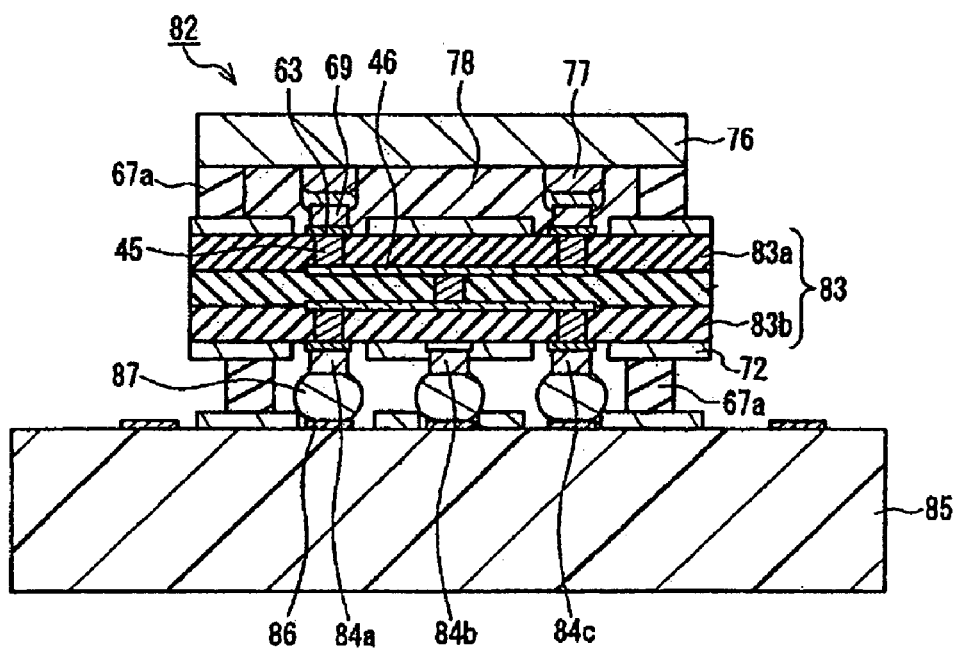
FIG. 9 is a cross-sectional view showing the electronic component module mounted on a parent substrate in Embodiment 4 of the present invention.
Figure 10:
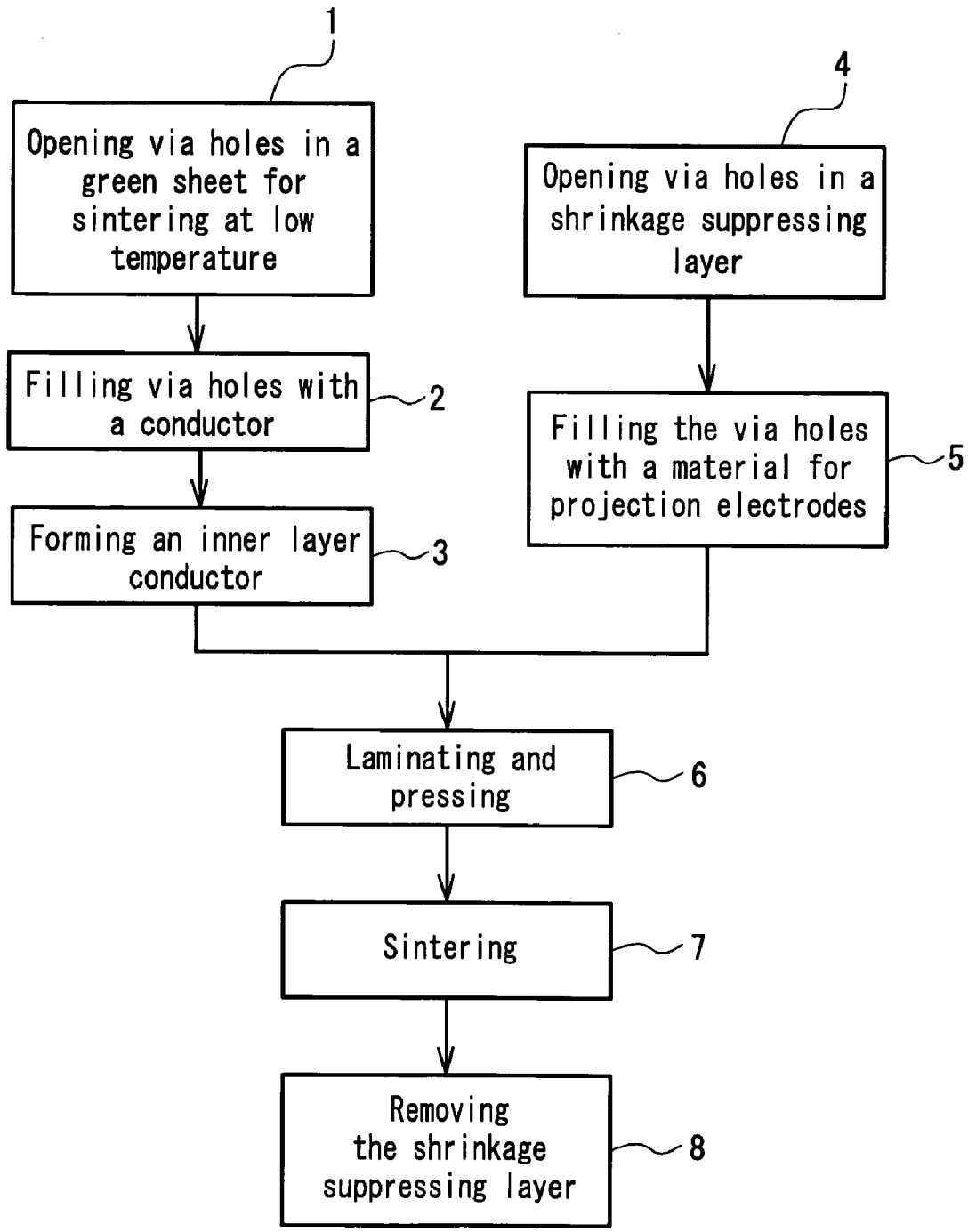
FIG. 10 is a production process flow chart for a conventional ceramic substrate.
Figure 11:
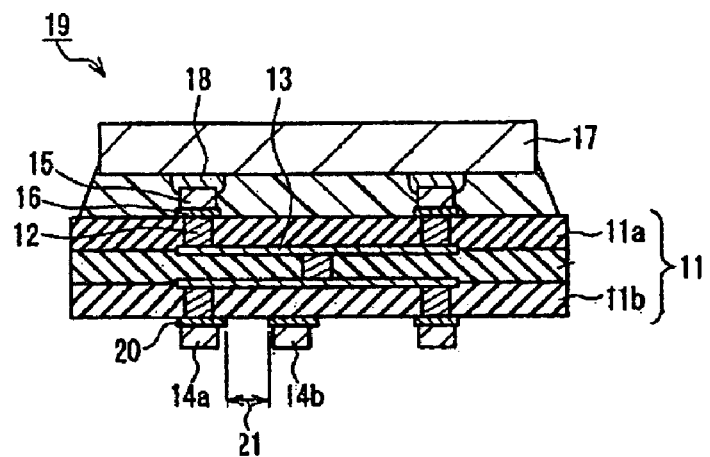
FIG. 11 is a cross-sectional view of an electronic component module using the conventional ceramic substrate.

FIG. 9 shows a state where the electronic component module 82 thus formed is mounted on a parent substrate 85. That is, the insulators 72 and 67a are provided so as to be overlapped with each other, so that the insulator 67a is formed to be higher than the projection electrodes 84a, 84b, and 84c.

Because of the above, when the electronic component module 82 is mounted on the parent substrate 85, there is a gap between lands 86 provided on the parent substrate 85 and the projection electrodes 84a, 84b, and 84c, whereby a solder 87 enters the gap to exactly connect the projection electrode 84a to the land 86. This also applies to the projection electrodes 84b and 84c. Because of this, the solder 87 will not flow in a horizontal direction. Furthermore, even if the distance between the projection electrodes 84a, 84b, and 84c is small, a short will not occur.

If convex portions composed of an insulator are formed respectively between the projection electrodes 84a, 84b, and 84c, the possibility of a short between the projection electrodes 84a, 84b, and 84c is decreased further.

The ceramic substrate according to the present invention has convex portions formed on an outermost layer, so that it is useful as various kinds of electronic component modules, etc.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing a ceramic substrate having first convex portions composed of a conductive thick film material and second convex portions composed of an insulating thick film material on a surface, comprising:
    a first process of providing first holes for the first convex portions and second holes for the second convex portions at a distance of 50 μm or more in a first unbaked sheet and providing third holes in a second unbaked sheet;
    a second process of filling the first holes with a conductive paste and the second and third holes with an insulating paste after the first process;
    a third process of laminating the first unbaked sheet filled with the conductive paste and the insulating paste on an outermost layer of a sintered ceramic substrate, and further laminating the second unbaked sheet filled with the insulating paste on the first unbaked sheet with the second and third holes aligned followed by pressing, thereby forming a laminate, after the second process;
    a fourth process of sintering the laminate after the third process; and
    a fifth process of removing the unbaked sheets after the fourth process.

2. The method for producing a ceramic substrate according to claim 1, wherein the laminate is sintered at 800° C. or higher in the fourth process.

3. The method for producing a ceramic substrate according to claim 1, wherein, after the third process, a degreasing process of degreasing the laminate by heating is performed, and thereafter, the fourth process is performed.

4. The method for producing a ceramic substrate according to claim 1, wherein a sintering temperature of the laminate in the fourth process is set to be the same as a baking temperature of at least one of the conductive thick film material and the insulating thick film material.

5. The method for producing a ceramic substrate according to claim 1, wherein at least one of the first and second unbaked sheets are obtained by mixing alumina powder and an organic binder, and forming the mixture into an alumina sheet.

6. The method for producing a ceramic substrate according to claim 1, wherein, in the third process, the unbaked sheets filled with the thick film materials are laminated on a front surface and a back surface of the outermost layer of the sintered ceramic substrate.

7. An electronic component module using a ceramic substrate having first convex portions composed of a conductive thick film material and second convex portions composed of an insulating thick film material on a surface,
wherein first holes for the first convex portions and second holes for the second convex portions are opened at a distance of 50 µm or more in a first unbaked sheet,
third holes for the second convex portions are provided in a second unbaked sheet, the first holes are filled with a conductive paste, and the second and third holes are filled with an insulating paste,
the first unbaked sheet filled with the conductive paste and the insulating paste is laminated on a front surface and a back surface of an outermost aver of the sintered ceramic substrate, and the second unbaked sheet filled with the insulating paste further is laminated on the first unbaked sheet with the second and third holes aligned, followed by pressing, thereby forming a laminate,
the laminate is sintered, and the unbaked sheets are removed to form the first and second convex portions, and
an electronic component is mounted on at least one surface selected from the front surface and the back surface of the obtained ceramic substrate.

8. The electronic component module according to claim 7, wherein a height of the convex portions is in a range of 25 to 300 µm.

9. The electronic component module according to claim 7, wherein a diameter of the convex portions is in a range of 50 to 500 µm.

10. A method for producing a ceramic substrate having convex portions composed of a thick film material on a surface, comprising:
a first process of providing first and second holes in a first unbaked sheet, and providing third holes in a second unbaked sheet;
a second process of filling the first holes with the a conductive paste and filling the second and third holes with an insulating paste after the first process;
a third process of laminating the first unbaked sheet filled with the conductive paste and the insulating paste on an outermost layer of a sintered ceramic substrate, and laminating the second unbaked sheet filled with the insulating paste on the first unbaked sheet with the second and third holes aligned, followed by pressing, thereby forming a laminate, after the second process;
a fourth process of sintering the laminate after the third process; and
a fifth process of removing the unbaked sheets after the fourth process.

11. An electronic component module using a ceramic substrate having convex portions composed of a thick film material on a surface,
wherein first and second holes are opened in a first unbaked sheet, and third holes are opened in a second unbaked sheet,
the first holes are filled with a conductive paste and the second and third holes are filled with an insulating paste,
the first unbaked sheet filled with the conductive paste and the insulating paste is laminated on a front surface and a back surface of an outermost layer of the sintered ceramic substrate, and the second unbaked sheet filled with the insulating paste is laminated on the first unbaked sheet with the second and third holes aligned, followed by pressing, thereby forming a laminate;
the laminate is sintered, and the unbaked sheets are removed to form the convex portions, and
an electronic component is mounted on at least one surface selected from the front surface and the back surface of the obtained ceramic substrate.

* * * * *